United States Patent
Ohtake et al.

(10) Patent No.: US 10,401,434 B2
(45) Date of Patent: Sep. 3, 2019

(54) SEMICONDUCTOR DEVICE, BATTERY MONITORING DEVICE, AND VOLTAGE DETECTION METHOD OF BATTERY CELL

(71) Applicant: LAPIS SEMICONDUCTOR CO., LTD., Kanagawa (JP)

(72) Inventors: Hisao Ohtake, Kanagawa (JP); Naoaki Sugimura, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 4 days.

(21) Appl. No.: 15/208,635

(22) Filed: Jul. 13, 2016

(65) Prior Publication Data

US 2017/0018945 A1 Jan. 19, 2017

(30) Foreign Application Priority Data

Jul. 16, 2015 (JP) ................................. 2015-142276

(51) Int. Cl.
*H02J 7/00* (2006.01)
*G01R 31/3835* (2019.01)
*G01R 31/396* (2019.01)

(52) U.S. Cl.
CPC ....... *G01R 31/3835* (2019.01); *G01R 31/396* (2019.01)

(58) Field of Classification Search
CPC .... Y02E 60/12; G01R 31/3658; H02J 7/0021; H02J 7/0016; Y02T 10/7055

(Continued)

(56) References Cited

U.S. PATENT DOCUMENTS

| 3,740,569 A | * | 6/1973 | Carcia | ..................... G05F 1/569 |
| | | | | 307/11 |
| 6,621,273 B2 | | 9/2003 | Takada et al. | |

(Continued)

FOREIGN PATENT DOCUMENTS

| JP | 2001-056350 A | 2/2001 |
| JP | 2002139523 A | 5/2002 |

(Continued)

OTHER PUBLICATIONS

Japanese Office Action dated Feb. 26, 2019, 10 pgs.
Japanese Notice of reasons for Rejection dated Jul. 2, 2019, Application No. 2015-142276, 7 pgs.

*Primary Examiner* — Arun C Williams
(74) *Attorney, Agent, or Firm* — Volentine, Whitt & Francos, PLLC

(57) ABSTRACT

A semiconductor device including plural first switches, each provided so as to correspond to one of plural battery cells connected in series, each first switch including one end connected to a corresponding battery cell and another end connected to one electrode of a corresponding charge storage section of plural charge storage sections, each of the charge storage sections being provided so as to correspond to one of the plural battery cells, and another electrode of each charge storage section being connected to a fixed potential; plural second switches, each provided so as to correspond to one of the plural first switches, each second switch including one end connected to the other end of the corresponding first switch; and processing section connected to each other end of the plural second switches, that processes voltages supplied via the second switches.

9 Claims, 5 Drawing Sheets

(58) Field of Classification Search
USPC .......................................................... 320/116
See application file for complete search history.

(56) References Cited

U.S. PATENT DOCUMENTS

| | | | |
|---|---|---|---|
| 8,786,289 | B2 | 7/2014 | Sekiguchi |
| 10,020,661 | B2 | 7/2018 | Fujii et al. |
| 2001/0019269 | A1* | 9/2001 | Yudahira ................. B60K 6/28 324/426 |
| 2002/0017895 | A1* | 2/2002 | Kawashima .......... H02J 7/0019 320/118 |
| 2002/0070733 | A1* | 6/2002 | Takada ............... G01R 31/3658 324/647 |
| 2006/0001403 | A1* | 1/2006 | Yudahira .......... G01R 19/16542 320/134 |
| 2008/0191553 | A1* | 8/2008 | Kawamura ............ G09G 3/293 307/31 |
| 2009/0128158 | A1* | 5/2009 | Kawai ................... B60L 3/0046 324/433 |

FOREIGN PATENT DOCUMENTS

| | | |
|---|---|---|
| JP | 2005091136 A | 4/2005 |
| JP | 2011232161 A | 11/2011 |
| JP | 2014064404 A | 4/2014 |

* cited by examiner

SEMICONDUCTOR DEVICE, BATTERY MONITORING DEVICE, AND VOLTAGE DETECTION METHOD OF BATTERY CELL

CROSS-REFERENCE TO RELATED APPLICATION

This application claims priority under 35 USC 119 from Japanese Patent Application No. 2015-142276, filed on Jul. 16, 2015, the disclosure of which is incorporated by reference herein.

BACKGROUND

Technical Field

The present disclosure relates to a semiconductor device, a battery monitoring device, and a voltage detection method of a battery cell.

Related Art

As a technique for detecting a cell voltage of each of plural battery cells connected in series, the following technology is known. For example, in Japanese Patent Application Laid-Open (JP-A) No. 2001-56350, a voltage detection circuit for detecting voltages of an assembled battery including plural sample-and-hold circuits configured capable of holding a voltage of each unit battery between both electrodes of each capacitor, is described. In this voltage detection circuit, a capacitor group in which plural capacitors are connected in series is provided so as to corresponds to an assembled battery including plural unit batteries connected in series, and switches for sample-and-hold are provided at each of plural parallel lines. The plural parallel lines connect, between the assembled battery and the capacitor group, both electrodes of each unit battery and both electrodes of each capacitor that are arranged at the same order with each other. The voltage detection circuit includes a switch control means that simultaneously turns OFF the switches for sample-and-hold, and a voltage detection means detects a voltage between both electrodes of each capacitor by sequentially taking in a voltage between predetermined portions of the capacitor group when the switches for sample-and-hold are turned OFF.

However, in the voltage detection circuit described in JP-A No. 2001-56350, since the switches for sample-and-hold are connected to both electrodes of the capacitor, noise generated by operation of the sample-and-hold switches influences to the charges to be stored in the capacitor, and thus, accuracy of voltage detection of each unit battery (battery cell) may be decreased.

Recent years, in the battery monitoring devices, accuracy in detection of the cell voltage has been increasingly required, and decrease in accuracy of voltage detection as described above has become unacceptable.

SUMMARY

The present disclosure provides a semiconductor device that may improve detection accuracy of the cell voltage.

A semiconductor device according to a first aspect includes: plural first switches, each provided so as to correspond to one of plural battery cells connected in series, each first switch including one end connected to a corresponding battery cell and another end connected to one electrode of a corresponding charge storage section of plural charge storage sections, each of the charge storage sections being provided so as to correspond to one of the plural battery cells, and another electrode of each charge storage section being connected to a fixed potential; plural second switches, each provided so as to correspond to one of the plural first switches, each second switch including one end connected to the other end of the corresponding first switch; and processing section connected to each other end of the plural second switches, that processes voltages supplied via the second switches.

A battery monitoring device according to a second aspect includes: the semiconductor device according to the first aspect; the plural battery cells; and the plural charge storage sections.

A voltage detection method of a battery cell according to a third aspect includes: providing plural charge storage sections such that each charge storage section corresponds to one of plural battery cells connected in series, the plural charge storage sections each including one electrode connected to a fixed potential; connecting each of the plural battery cells to another electrode of the corresponding charge storage section, to charge each of the plural charge storage sections; disconnecting a connection between each of the plural battery cells and each of the plural charge storage sections at a same timing; and sequentially detecting a charging voltage of each of the plural charge storage sections.

According to the above aspects, the present disclosure may provide a semiconductor device, a battery monitoring device, and a voltage detection method of a battery cell that may improve detection accuracy of the cell voltage.

BRIEF DESCRIPTION OF THE DRAWINGS

Exemplary embodiments will be described in detail based on the following figures, wherein.

DETAILED DESCRIPTION

Figure 1:
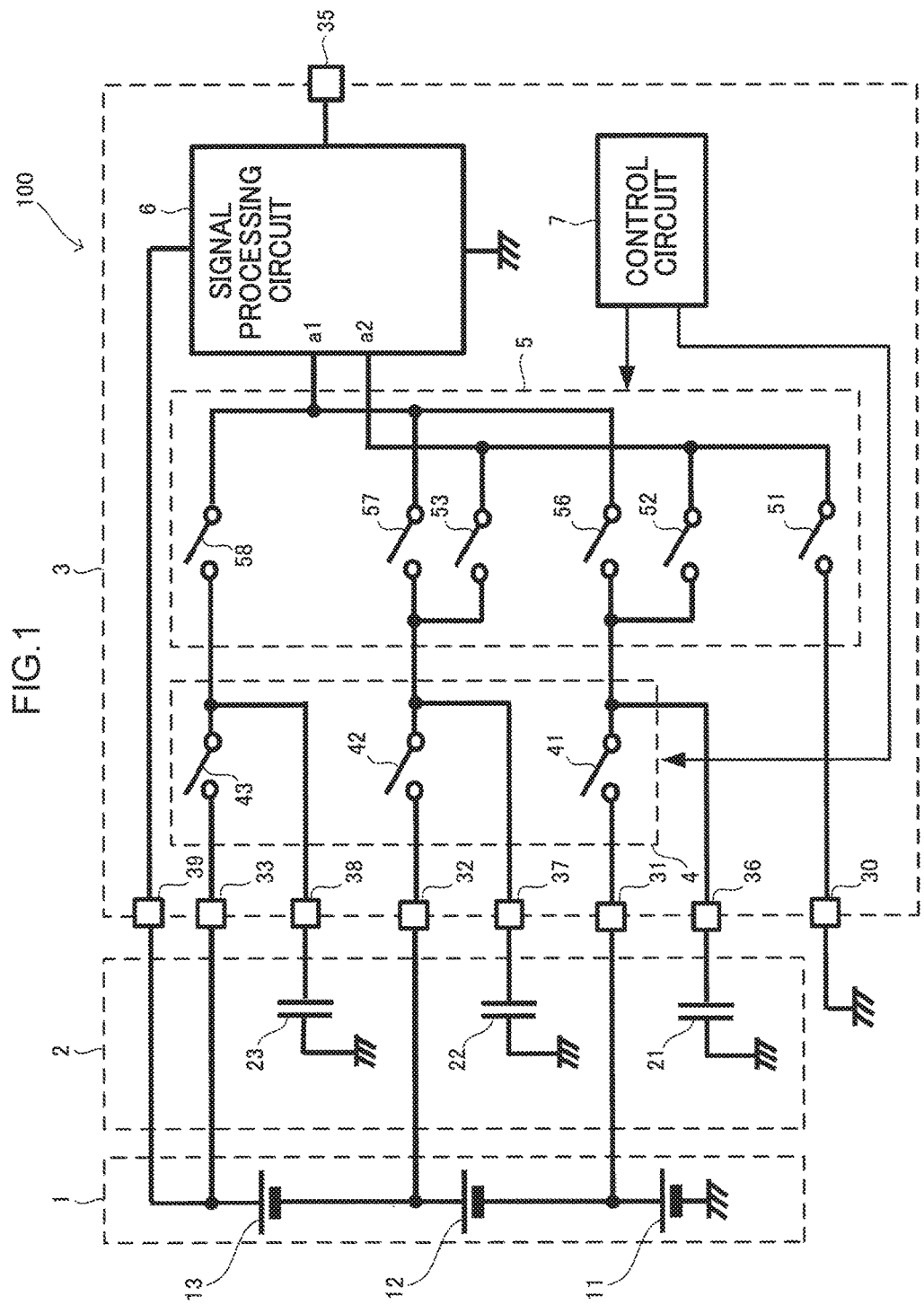
FIG. 1 is a diagram illustrating a configuration of a battery monitoring device according to an exemplary embodiment of the present disclosure.

Hereinafter, exemplary embodiments of the present disclosure is described with reference to the drawings. Note that the same reference numerals are added to the same or equivalent components and portions in the drawings, and redundant description thereof is omitted, if appropriate.

First Exemplary Embodiment

FIG. 1 is a diagram illustrating a configuration of a battery monitoring device 100 according to a first exemplary embodiment of the present disclosure. The battery monitoring device 100 is configured including an assembled battery 1, a capacitor group 2, and a battery monitoring IC (Integrated Circuit) 3.

The assembled battery 1 includes plural battery cells 11, 12, and 13 that are connected in series. In an example illustrated in FIG. 1, the number of battery cells configuring the assembled battery 1 is three. However, the number of battery cells configuring the assembled battery 1 may be increased or decreased, if appropriate.

The capacitor group 2 is configured to include capacitors 21, 22, and 23, each of which is provided respectively so as to correspond to the battery cells 11, 12, and 13. One electrode of each of the capacitors 21, 22, and 23 is fixed to a around potential, and the other electrode is connected to the battery monitoring IC 3. The number of capacitors included in the capacitor group 2 may be increased or decreased depending on the number of battery cells, if appropriate.

The battery monitoring IC 3 is configured as a semiconductor device including an integrated circuit formed on a semiconductor substrate. The battery monitoring IC 3 is configured to include cell voltage input terminals 31, 32, and 33, capacitor connection terminals 36, 37, and 38, a around terminal 30, a power supply terminal 39, an output terminal 35, a sample-and-hold switch group 4, a cell selection switch group 5, a signal processing circuit 6, and a control circuit 7.

The connection point between the positive electrode of the battery cell 11 and the negative electrode of the battery cell 12 is connected to the cell voltage input terminal 31 of the battery monitoring IC 3. The connection point between the positive electrode of the battery cell 12 and the negative electrode of the battery cell 13 is connected to the cell voltage input terminal 32 of the battery monitoring IC 3. The positive electrode of the battery cell 13 is connected to the cell voltage input terminal 33 of the battery monitoring IC 3.

The opposite side electrode of the capacitor 21, opposite to the electrode fixed to the ground potential, is connected to the capacitor connection terminal 36. The opposite side electrode of the capacitor 22, opposite to the electrode fixed to the ground potential, is connected to the capacitor connection terminal 37. The opposite side electrode of the capacitor 23, opposite to the electrode fixed to the ground potential, is connected to the capacitor connection terminal 38.

The sample-and-hold switch group 4 is configured to include sample-and-hold switches 41, 42, and 43, each of which is provided respectively so as to correspond to the battery cells 11, 12, and 13. The input end of the sample-and-hold switch 41 is connected to the positive electrode of the corresponding battery cell 11 via the cell voltage input terminal 31. The output end of the sample-and-hold switch 41 is connected to the opposite side electrode of the capacitor 21, opposite to the electrode fixed to the ground potential, via the capacitor connection terminal 36. In a case in which the sample-and-hold switch 41 is turned ON, the capacitor 21 and the battery cell 11 are connected to each other, and the capacitor 21 is charged by a voltage of the positive electrode of the battery cell 11.

The input end of the sample-and-hold switch 42 is connected to the positive electrode of the corresponding battery cell 12 via the cell voltage input terminal 32. The output end of the sample-and-hold switch 42 is connected to the opposite side electrode of the capacitor 22, opposite to the electrode fixed to the ground potential, via the capacitor connection terminal 37. In a case in which the sample-and-hold switch 42 is turned ON, the capacitor 22 and the battery cell 12 are connected to each other, and the capacitor 22 is charged by a voltage of the positive electrode of the battery cell 12.

The input end of the sample-and-hold switch 43 is connected to the positive electrode of the corresponding battery cell 13 via the cell voltage input terminal 33. The output end of the sample-and-hold switch 43 is connected to the opposite side electrode of the capacitor 23, opposite to the electrode fixed to the ground potential, via the capacitor connection terminal 38. In a case in which the sample-and-hold switch 43 is turned ON, the capacitor 23 and the battery cell 13 are connected to each other, and the capacitor 23 is charged by a voltage of the positive electrode of the battery cell 13.

The cell selection switch group 5 has high potential side switches 56, and 58, each of which is provided respectively so as to correspond to the battery cells 11, 12, and 13, and the sample-and-hold switches 41, 42, and 43.

The input end of the high potential side switch 56 is connected to the output end of the sample-and-hold switch 41. The output end of the high potential side switch 56 is connected to a high potential side input end a1 of the signal processing circuit 6.

The input end of the high potential side switch 57 is connected to the output end of the sample-and-hold switch 42. The output end of the high potential side switch 57 is connected to the high potential side input end a1 of the signal processing circuit 6.

The input end of the high potential side switch 58 is connected to the output end of the sample-and-hold switch 41. The output end of the high potential side switch 58 is connected to the high potential side input end a1 of the signal processing circuit 6.

The cell selection switch group 5 further has a low potential side switch 51 whose input end is connected to the ground potential via the ground terminal 30, and low potential side switches 52, 53 each of which is provided so as to correspond to the sample-and-hold switches 41 and 42 that are corresponding respectively to the battery cells 11 and 12, except for the battery cell 13 positioned at the highest potential.

The input end of the low potential side switch 52 is connected to the output end of the sample-and-hold switch 41. The output end of the low potential side switch 52 is connected to a low potential side input end a2 of the signal processing circuit 6.

The input end of the low potential side switch 53 is connected to the output end of the sample-and-hold switch 42. The output end of the low potential side switch 53 is connected to the low potential side input end a2 of the signal processing circuit 6.

The input end of the low potential side switch 51 is connected to the ground terminal 30. The output end of the low potential side switch 51 is connected to the low potential side input end a2 of the signal processing circuit 6.

The control circuit 7 supplies control signals to the sample-and-hold switches 41, 42, and 43 (the sample-and-hold switch group 4), the low potential side switches 51, 52, 53, and the high potential side switches 56, 57, 58 (the cell selection switch group 5), to control ON/OFF of those switches.

The signal processing circuit 6 processes the voltages supplied via the switches configuring the cell selection switch group 5, and outputs an output signal indicating magnitude of each cell voltage of the battery cells 11, 12, and 13 from the output terminal 35. The signal processing circuit 6 is operated by a power supply voltage supplied from the positive electrode of the battery cell 13 via the power supply terminal 39. Note that, the signal processing circuit 6 may be supplied by a voltage in which a voltage level positive electrode of the battery cell 13 is adjusted by a DC-DC converter.

Figure 2:
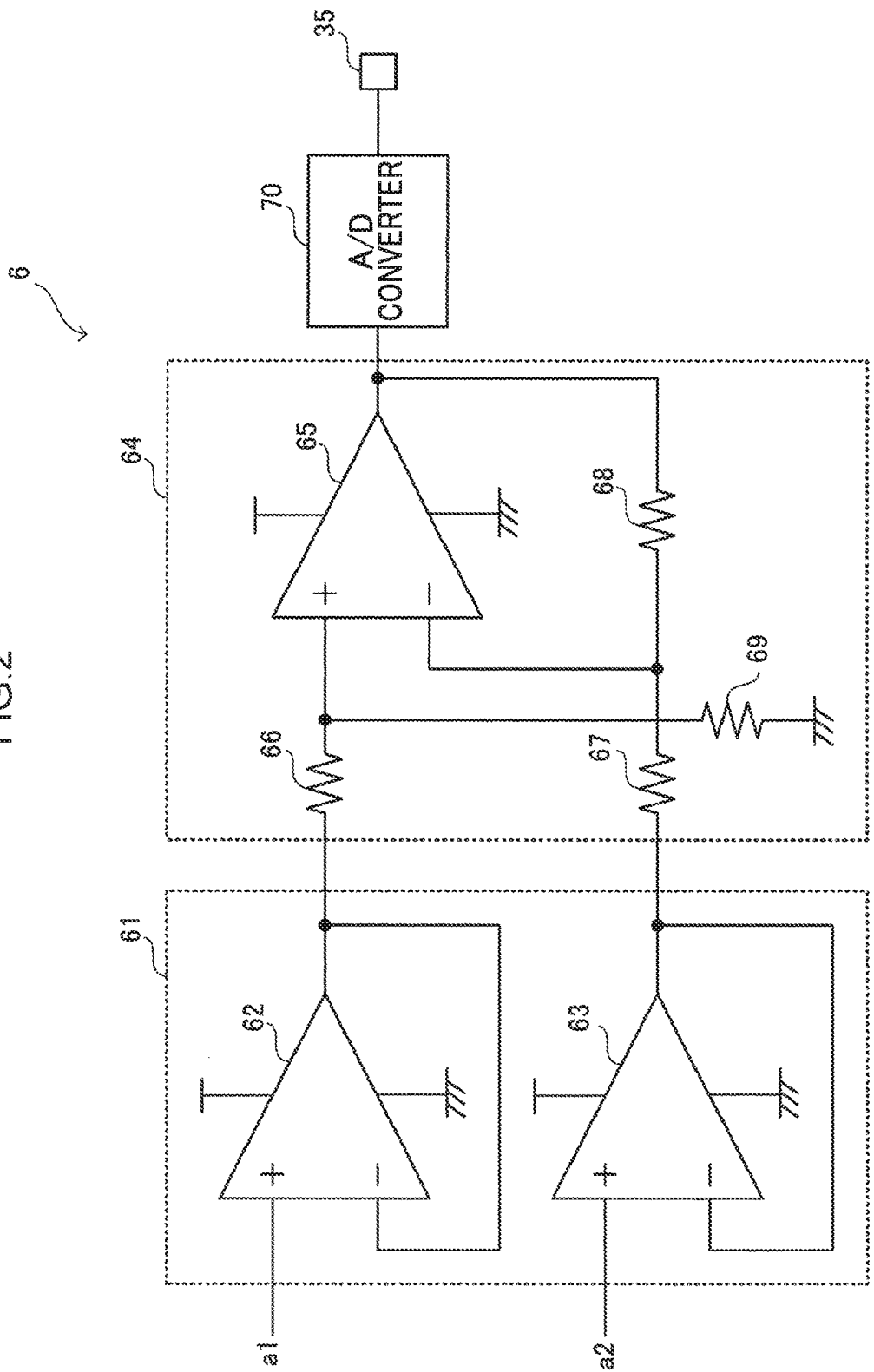
FIG. 2 is a circuit block diagram illustrating a configuration of a signal processing circuit according to the present disclosure.

FIG. 2 is a circuit block diagram illustrating an example configuration of the signal processing circuit 6. As illustrated in FIG. 2, the signal processing circuit 6 is configured to include, for example, a buffer amplifier 61, a level-shift circuit 64, and an A/D (analog/digital) converter 70.

The buffer amplifier 61 is configured to include operational amplifier circuits 62 and 63. The non-inverting input terminal of the operational amplifier circuit 62 is connected to the high potential side input end a1 of the signal processing circuit 6, and the inverting input terminal is connected to the output terminal of the operational amplifier circuit 62. Namely, the operational amplifier circuit 62 configures a voltage follower, and performs impedance conversion of a voltage input to the input end a1 while keeping its magnitude, and outputs the voltage. Similarly, the non-inverting input terminal of the operational amplifier circuit 63 is connected to the low potential side input end a2 of the signal processing circuit 6, and the inverting input terminal is connected to the output terminal of the operational amplifier circuit 63. Namely, the operational amplifier circuit 63 configures a voltage follower, and performs impedance conversion of a voltage input to the input end a2 while keeping its magnitude, and outputs the voltage.

The level-shift circuit 64 is configured to include an operational amplifier circuit 65, and resistor elements 66, 67, 68, and 69. The non-inverting input terminal of the operational amplifier circuit 65 is connected to the output terminal of the operational amplifier circuit 62 via the resistor element 66. Further, the non-inverting input terminal of the operational amplifier circuit 65 is connected to the ground potential via the resistor element 69. The inverting input terminal of the operational amplifier circuit 65 is connected to the output terminal of the operational amplifier circuit 63 via the resistor element 67. Further, the inverting input terminal of the operational amplifier circuit 65 is connected to the output terminal of the operational amplifier circuit 65 via the resistor element 68. The level-shift circuit 64 is a difference voltage output circuit that outputs a difference voltage. The difference voltage is a difference between a voltage input to the input end a1 and a voltage input to the input end a2, and has a level with the ground potential as a reference.

The A/D converter 70 generates a digital signal according to a voltage output from the level-shift circuit 64, and outputs the digital signal from the output terminal 35.

Figure 3:
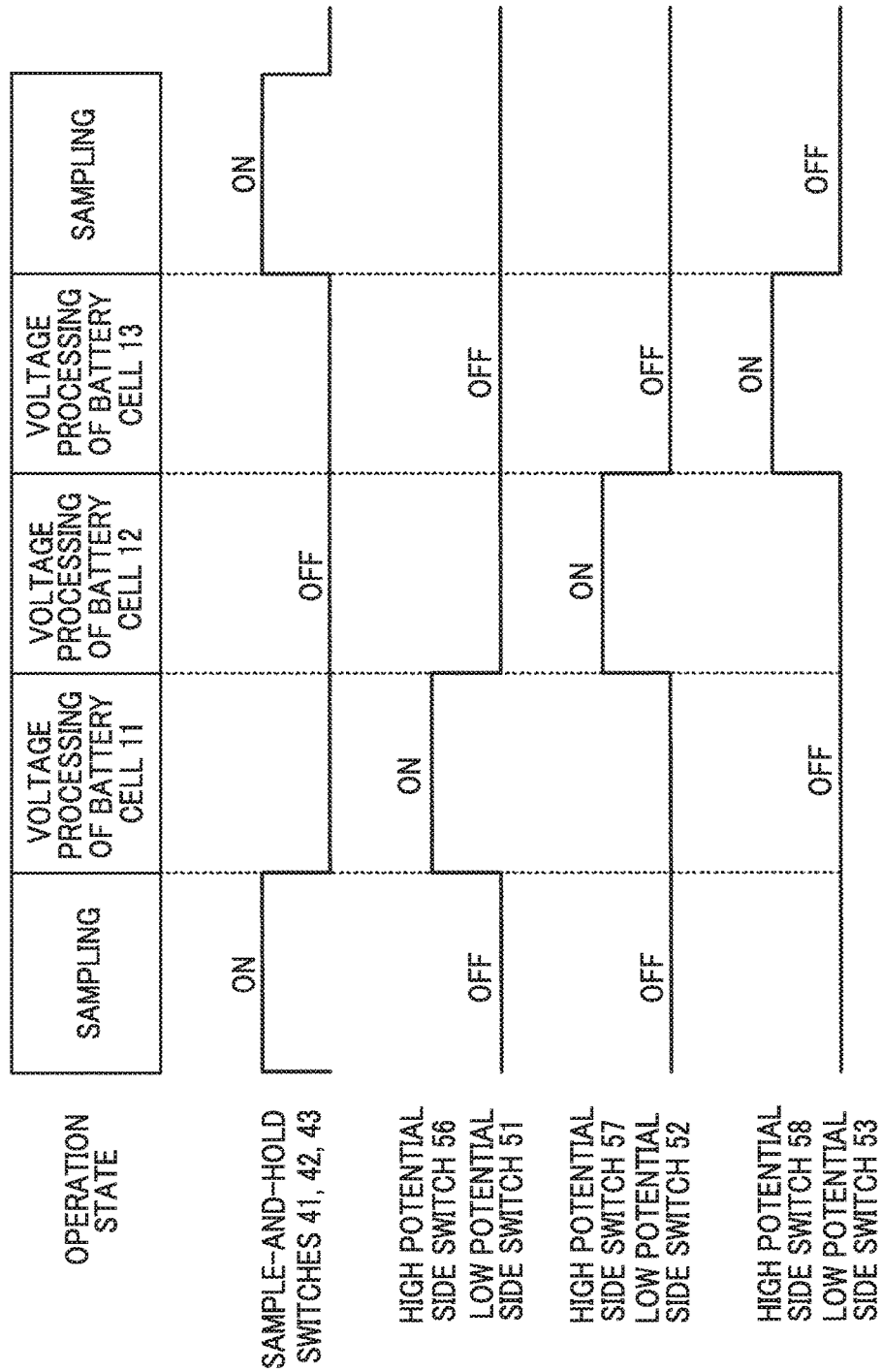
FIG. 3 is a timing chart illustrating operation of a battery monitoring IC according to the exemplary embodiment of the present disclosure.

Hereinafter, operation is described of the battery monitoring device 100. FIG. 3 is a timing chart illustrating operation of the battery monitoring IC 3, in a case in which the cell voltages of the battery cells 11, 12, and 13 are detected.

First, the control circuit 7 controls the sample-and-hold switches 41, 42, and 43 to be turned ON simultaneously. Thus, the capacitor 21 and the battery cell 11 are connected to each other, and the capacitor 21 is charged by the voltage of the positive electrode of the battery cell 11. Similarly, the capacitor 22 and the battery cell 12 are connected to each other, and the capacitor 22 is charged by the voltage of the positive electrode of the battery cell 12. Also, the capacitor 23 and the battery cell 13 are connected to each other, and the capacitor 23 is charged by the voltage of the positive electrode of the battery cell 13. In a case in which charging of the capacitors 21, 22, 23 are completed, the control circuit 7 controls the sample-and-hold switches 41, 42, and 43 to be turned OFF simultaneously. In a case in which the sample-and-hold switches 41, 42, and 43 are turned from ON to OFF at the same timing, the cell voltages of the battery cells 11, 12, and 13 are sampled at the same point in time. Note that, in this sampling process, the capacitors 21, 22, and 23 needs to be in full charged state, and thus, timings when the sample-and-hold switch 41, 42, and 43 are turned ON does not need to be the same.

Next, the control circuit 7 controls, out of the switches configuring the cell selection switch group 5, the low potential side switch 51 and the high potential side switch 56 to be turned ON. Thus, the high potential side input end a1 of the signal processing circuit 6 is connected to the capacitor 21, and the low potential side input end a2 of the signal processing circuit 6 is connected to the ground potential. Namely, the voltage corresponding to the cell voltage of the battery cell 11 is input to the signal processing circuit 6. The signal processing circuit 6 performs impedance conversion process, level-shift process, and digital conversion process to the input voltage, and outputs an output signal indicating the cell voltage of the battery cell 11 from the output terminal 35. Note that, since the signal processing circuit 6 receives the voltage input to the input ends a1 and a2 by the buffer amplifier 61 having high input impedance, the charges stored in the capacitor 21 are kept without being discharged. Namely, the voltage sampled from the cell voltage of the battery cell 11 is kept in the capacitor 21.

Next, the control circuit 7 controls, out of the switches configuring the cell selection switch group 5, the low potential side switch 52 and the high potential side switch 57 to be turned ON. Thus, the high potential side input end a1 of the signal processing circuit 6 is connected to the capacitor 22, and the low potential side input end a2 of the signal processing circuit 6 is connected to the capacitor 21. Namely, the voltage corresponding to the cell voltage of the battery cell 12 is input to the signal processing circuit 6. The signal processing circuit 6 performs impedance conversion process, level-shift process, and digital conversion process to the input voltage, and outputs the output signal indicating the cell voltage of the battery cell 12 from the output terminal 35. Note that, since the signal processing circuit 6 receives the voltage input to the input ends a1 and a2 by the buffer amplifier 61 having high input impedance, the charges stored in the capacitors 21 and 22 are kept without being discharged. Namely, the voltage sampled from the cell voltage of the battery cell 12 is kept in the capacitor 22.

Next, the control circuit 7 controls, out of the switches configuring the cell selection switch group 5, the low potential side switch 53 and the high potential side switch 58 to be turned ON. Thus, the high potential side input end a1 of the signal processing circuit 6 is connected to the capacitor 23, and the low potential side input end a2 of the signal processing circuit 6 is connected to the capacitor 22. Namely, the voltage corresponding to the cell voltage of the battery cell 13 is input to the signal processing circuit 6. The signal processing circuit 6 performs impedance conversion process, level-shift process, and digital conversion process to the input voltage, and outputs the output signal indicating the cell voltage of the battery cell 13 from the output terminal 35. Note that, since the signal processing circuit 6 receives the voltage input to the input ends a1 and a2 by the buffer amplifier 61 having high input impedance, the charges stored in the capacitor 22 and 23 are kept without being discharged. Namely, the voltage sampled from the cell voltage of the battery cell 13 is kept in the capacitor 23.

Figure 5:
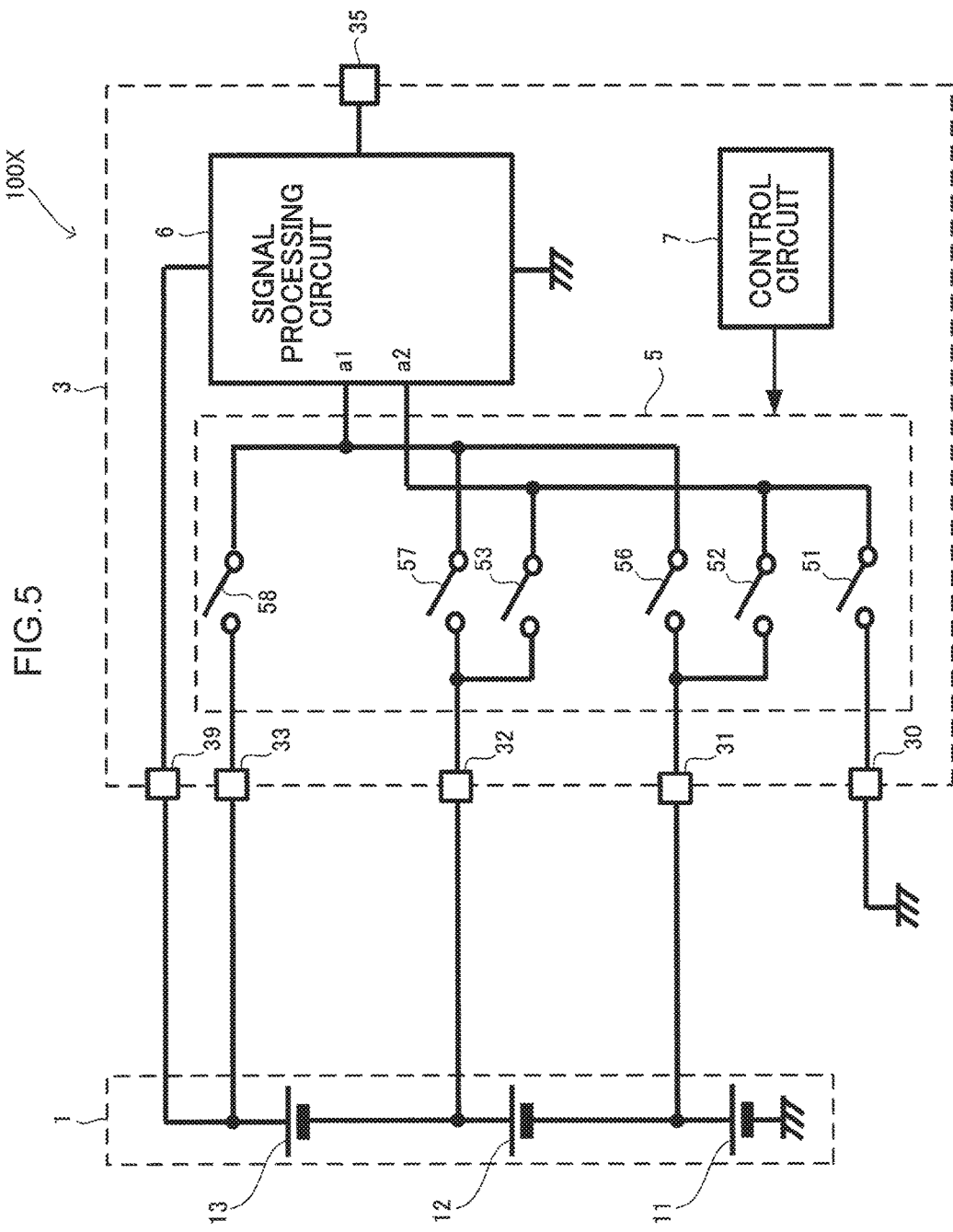
FIG. 5 is a diagram illustrating a configuration of a battery monitoring device according to a comparative example.

Here, FIG. 5 is a diagram illustrating a configuration of a battery monitoring device 100X according to a comparative example. The battery monitoring device 100X according to the comparative example is different from the battery monitoring device 100 according to the exemplary embodiment of the present disclosure described above, in that the battery monitoring device 100X does not have a sample-and-hold switch group and a capacitor group for sample-and-hold.

Hereinafter, a case in which the cell voltages of the battery cells 11, 12, and 13 are detected by the battery monitoring device 100X according to the comparative example, will be described.

The control circuit 7 controls, out of the switches configuring the cell selection switch group 5, the low potential side switch 51 and the high potential side switch 56 to be turned ON. Thus, the high potential side input end a1 of signal processing circuit 6 is connected to the positive electrode of the battery cell 11, and the low potential side input end a2 of the signal processing circuit 6 is connected to the ground potential. Namely, the cell voltage of the battery cell 11 is input to the signal processing circuit 6. The signal processing circuit 6 performs impedance conversion process, level-shift process, and digital conversion process to the input voltage, and outputs the output signal indicating the cell voltage of the battery cell 11 from the output terminal 35.

Next, the control circuit 7 controls, out of the switches configuring the cell selection switch group 5, the low potential side switch 52 and the high potential side switch 57 to be turned ON. Thus, the high potential side input end a1 of the signal processing circuit 6 is connected to the positive electrode of the battery cell 12, and the low potential side input end a2 of the signal processing circuit 6 is connected to the negative electrode of the battery cell 12. Namely, the cell voltage of the battery cell 12 is input to the signal processing circuit 6. The signal processing circuit 6 performs impedance conversion process, level-shift process, and digital conversion process to the input voltage, and outputs the output signal indicating the cell voltage of the battery cell 12 from the output terminal 35.

Next, the control circuit 7 controls, out of the switches configuring the cell selection switch group 5, the low potential side switch 53 and the high potential side switch 58 to be turned ON. Thus, the high potential side input end a1 of the signal processing circuit 6 is connected to the positive electrode of the battery cell 13, and the low potential side input end a2 of the signal processing circuit 6 is connected to the negative electrode of the battery cell 13. Namely, the cell voltage of the battery cell 13 is input to the signal processing circuit 6. The signal processing circuit 6 performs impedance conversion process, level-shift process, and digital conversion process to the voltage input, and outputs the output signal indicating the cell voltage of the battery cell 13 from the output terminal 35.

In this way, in the battery monitoring device 100X according to the comparative example, the battery cells 11, 12, and 13 are sequentially connected to the signal processing circuit 6, and the respective cell voltages are sequentially detected. Namely, in the battery monitoring device 100X according to the comparative example, the cell voltages of the battery cells 11, 12, and 13 are detected and output at different point in time from each other. In order to accurately detect the state of each of the battery cells configuring the assembled battery, it is desirable to detect the cell voltages at the same point in time for each of the battery cells. In the battery monitoring device 100X according to the comparative example, the cell voltage cannot be measured at the same point in time, and thus, may be difficult to accurately detect the states of the battery cells 11, 12, and 13.

On the other hand, in the battery monitoring IC 3 and the battery monitoring device 100 according to the present disclosure, since the sample-and-hold switches 41, 42, and 43 are turned ON, and then turned OFF at the same timing, the cell voltages of the battery cells 11, 12, and 13 are sampled at the same timing. The cell voltages of the battery cells 11, 12, and 13 that are respectively stored in the capacitors 21, 22, and 23 are then sequentially transmitted to the signal processing circuit 6 to be processed. Therefore, the battery monitoring device 100 according to the present disclosure may detect the cell voltages of the battery cells 11, 12, and 13 configuring the assembled battery 1 at the same point in time, and thus, may accurately detect the states of the battery cells 11, 12, and 13.

In the battery monitoring IC 3 and the battery monitoring device 100 according to the present exemplary embodiment, one electrode of each of the capacitors 21 and 23 is fixed to the ground potential. Therefore, in comparison with the voltage detection circuit described in JP-A No. 2001-56350, in which both electrodes of the capacitor are connected to the switch for sample-and-hold, the present exemplary embodiment may reduce influence of noise generated by operation of the switch for sample-and-hold. Namely, the battery monitoring IC 3 and the battery monitoring device 100 according to the exemplary embodiment may improve detection accuracy of the cell voltage of each of the battery cells compared to the conventional devices.

Further, in the voltage detection circuit described in JP-A No. 2001-56350, in a case in which the voltages between both electrodes of each of the capacitors are sequentially detected, connects the low potential side electrode of each of the capacitors to the ground potential by turning the selection switch ON. Thus, the charges stored in the capacitors are almost completely discharged. Namely, in the voltage detection circuit described in JP-A No. 2001-56350, charging and discharging of the capacitor are repeated every time when detecting the cell voltage. Accordingly, power is consumed in each section of the battery (battery cell) every time when detecting the cell voltage. In addition, when the cell voltage is detected, since each capacitor is required to be fully charged from fully discharged state, a relatively long sampling time may be required.

On the other hand, in the battery monitoring IC 3 and the battery monitoring device 100 according to the exemplary embodiment of the present disclosure, since the cell voltages sampled in the capacitors 21, 22, and 23 are received by the buffer amplifier 61 of the signal processing circuit 6, the charges stored in the capacitors 21, 22, and 23 are kept without being discharged. Therefore, since charging and discharging are not repeated at every time when the cell voltages are detected, power consumption of the battery cells 11, 12, and 13 may be suppressed when sampling the cell voltage. In addition, even after the detection of the cell voltage, since the charges stored in the capacitors 21, 22, and 23 are kept, and since charging the capacitors from fully discharged state are not required when the cell voltages are detected next time, the sampling time may be shortened. Therefore, the battery monitoring device 100 according to the exemplary embodiment of the present disclosure may shorten the time required for detection of the cell voltages, compared to the voltage detection circuit described in JP-A No. 2001-56350.

In the battery monitoring IC 3 and the battery monitoring device 100 according to the exemplary embodiment, as described above, charges stored in the capacitors 21, 22, and 23 are kept, and the voltages of the capacitors 21, 22, and 23 are stable. Therefore, since a sufficient processing time may be secured in analog-digital conversion process by the A/D converter, detection accuracy of the cell voltage may be improved.

In the battery monitoring IC 3 and the battery monitoring device 100 according to the exemplary embodiment, since the capacitors 21, 22, and 23 are provided outside the battery monitoring IC 3, the chip size of the battery monitoring IC may be reduced, when compared to a case in which the capacitors 21, 22, and 23 are incorporated in the battery monitoring IC 3.

Second Exemplary Embodiment

Figure 4:
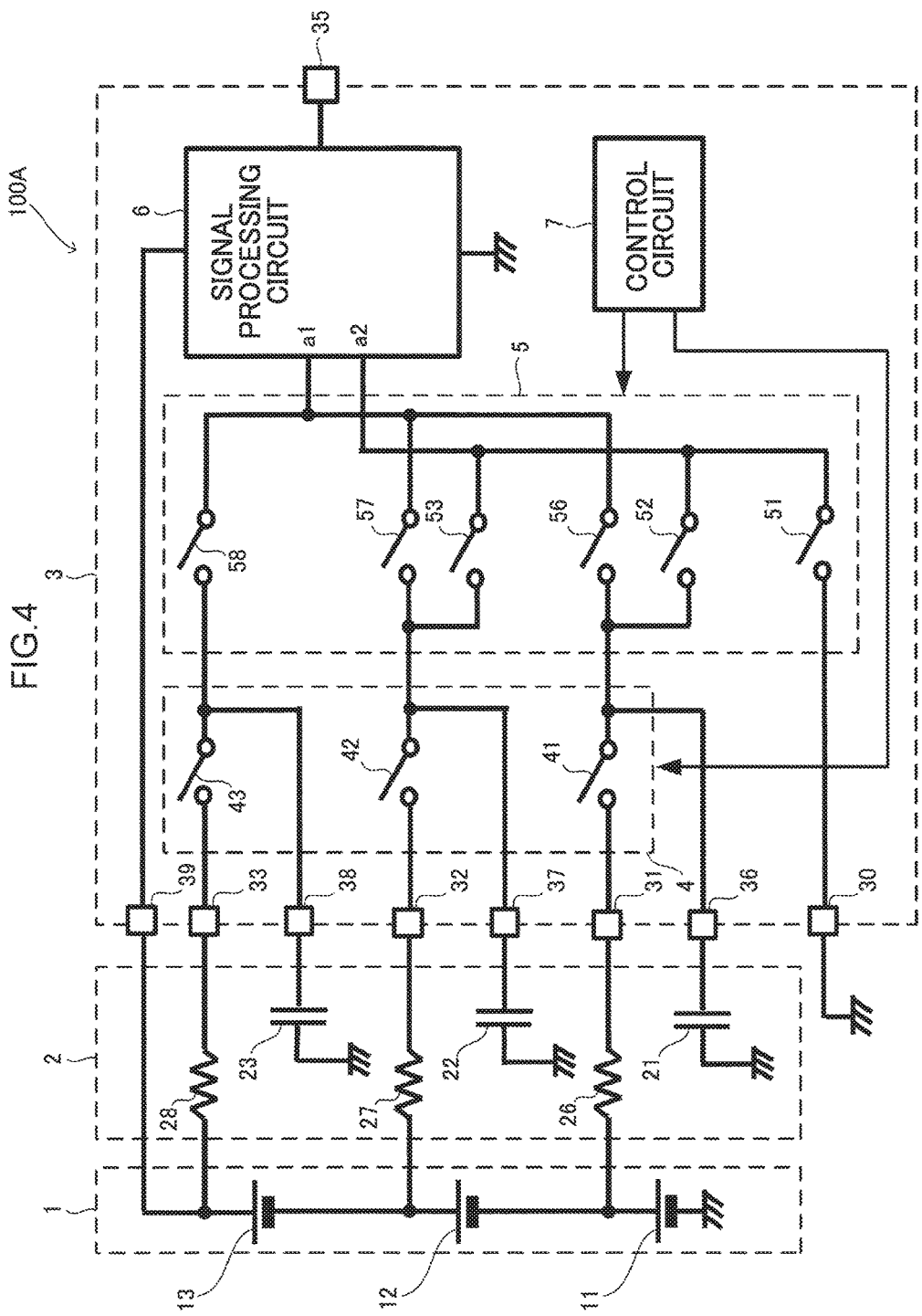
FIG. 4 is a diagram illustrating a configuration of a battery monitoring device according to another exemplary embodiment of the present disclosure.

FIG. 4 is a diagram illustrating a configuration of a battery monitoring device 100A according to a second exemplary embodiment of the present disclosure. The battery monitoring device 100A is different from the battery monitoring device 100 according to the first exemplary embodiment described above, in that the battery monitoring device 100A further includes resistor elements 26, 27, and 28 provided respectively no as to correspond to the battery cells 11, 12, and 13. Since other components are the same as of the battery monitoring device 100 according to the first exemplary embodiment, descriptions thereof will be omitted.

One end of the resistor element 26 is connected to the connection point between the positive electrode of the battery cell 11 and the negative electrode of the battery cell 12. The other end of the resistor element 26 is connected to the cell voltage input terminal 31. Namely, one end of the sample-and-hold switch 41 connected to the positive electrode of the corresponding battery cell 11 via the resistor element 26.

One end of the resistor element 27 is connected to the connection point between the positive electrode of the battery cell 12 and the negative electrode of the battery cell 13. The other end of the resistor element 27 is connected to the cell voltage input terminal 32. Namely, one end of the sample-and-hold switch 42 is connected to the positive electrode of the corresponding battery cell 12 via the resistor element 27.

One end of the resistor element 28 is connected to the positive electrode of the battery cell 13. The other end of the resistor element 28 is connected to the cell voltage input terminal 33. Namely, one end of the sample-and-hold switch 43 is connected to the positive electrode of the corresponding battery cell 13 via the resistor element 28.

Hereinafter, operation of the battery monitoring device 100A according to the second exemplary embodiment will be described. In the battery monitoring device 100A according to the second exemplary embodiment, operation of the battery monitoring IC 3 during detection of the cell voltages of the battery cells 11, 12, and 13 is the same as of the battery monitoring device 100 according to the first exemplary embodiment, and therefor is illustrated in the timing chart of FIG. 3.

First, the control circuit 7 controls the sample-and-hold switches 41, 42, and 43 to be turned ON simultaneously. In a case in which the sample-and-hold switch 41 is turned ON, the capacitor 21 and the battery cell 11 are connected to each other via the resistor element 26. A filter is configured by the capacitor 21 and the resistor element 26, and the capacitor 21 is charged by the cell voltage of the battery cell 11 in which high frequency noise is removed and is averaged.

Similarly, in a case in which the sample-and-hold switch 42 is turned ON, the capacitor 22 and the battery cell 12 are connected to each other via the resistor element 27. A filter is configured by the capacitor 22 and the resistor element 27, and the capacitor 22 is charged by the cell voltage of the battery cell 12 in which high frequency noise is removed and is averaged.

In a case in which the sample-and-hold switch 43 is turned ON, the capacitor 23 and the battery cell 13 are connected to each other via the resistor element 28. A filter is configured by the capacitor 23 and the resistor element 28, and the capacitor 23 is charged by the cell voltage of the battery cell 13 in which high frequency noise is removed and is averaged.

The control circuit 7, in a case in which charging of the capacitors 21, 22, 23 are completed, controls the sample-and-hold switches 41, 42, and 43 to be turned OFF simultaneously. Accordingly, in a case in which the sample-and-hold switches 41, 42, and 43 are turned from ON to OFF at the same timing, cell voltages of the battery cells 11, 12, and 13 are sampled at the same point in time. Note that, in this sampling process, the capacitors 21, 22, and 23 need to be full charged states, and thus, timings when the sample-and-hold switch 41, 42, and 43 are turned ON does not need to be the same.

Next, the control circuit 7 controls, out of the switches configuring the cell selection switch group 5, the low potential side switch 51 and the high potential side switch 56 to be turned ON. Thus, the high potential side input end a1 of the signal processing circuit 6 is connected to the capacitor 21, and the low potential side input end a2 of the signal processing circuit 6 is connected to the ground potential. Namely, the voltage corresponding to the cell voltage of the battery cell 11, in which high frequency noise is removed and is averaged, is input to the signal processing circuit 6. The signal processing circuit 6 performs impedance conversion process, level-shift process, and digital conversion process to the input voltage, and outputs the output signal indicating the cell voltage of the battery cell 11 from the output terminal 35. Note that, since the signal processing circuit 6 receives the voltages input to the input ends a1 and a2 by the buffer amplifier 61 having high input impedance, the charges stored in the capacitor 21 are kept without being discharged.

Next, the control circuit 7 controls, out of the switches configuring the cell selection switch group 5, the low potential side switch 52 and the high potential side switch 57 to be turned ON. Thus, the high potential side input end a1 of the signal processing circuit 6 is connected to the capacitor 22, and the low potential side input end a2 of the signal processing circuit 6 is connected to the capacitor 21. Namely, the voltage corresponding to the cell voltage of the battery cell 12, in which high frequency noise is removed and is averaged, is input to the signal processing circuit 6. The signal processing circuit 6 performs impedance conversion process, level-shift process, and digital conversion process to the input voltage, and outputs the output signal indicating the cell voltage of the battery cell 12 from the output terminal 35. Note that, since the signal processing circuit 6 receives the voltages input to the input ends a1 and a2 by the buffer amplifier 61 having high input impedance, the charges stored in the capacitor 21 and 22 are kept without being discharged.

Next, the control circuit 7 controls, out of the switches configuring the cell selection switch group 5, the low potential side switch 53 and the high potential side switch 58 to be turned ON. Thus, the high potential side input end a1 of the signal processing circuit 6 is connected to the capacitor 23, and the low potential side input end a2 of the signal processing circuit 6 is connected to the capacitor 22. Namely, the voltage corresponding to the cell voltage of the battery cell 13, in which high frequency noise is removed and is averaged, is input to the signal processing circuit 6. The signal processing circuit 6 performs impedance conversion process, level-shift process, and digital conversion process to the input voltage, and outputs the output signal indicating the cell voltage of the battery cell 13 from the output terminal 35. Note that, since the signal processing circuit 6 receives the voltage input to the input ends a1 and a2 by the buffer amplifier 61 having high input impedance, the charges stored in the capacitor 22 and 23 are kept without being discharged.

As described above, in the battery monitoring device 100A according to the second exemplary embodiment of the present disclosure, filter circuits are configured by the capacitors 21, 22, 23 and the resistor elements 26, 27, 28 in a case in which the cell voltages of the battery cells 11, 12, and 13 are sampled. Thus, since the capacitors 21, 22, and 23 are charged by the cell voltages in which the high frequency noise are removed and are averaged, the second exemplary embodiment may further improve detection accuracy of the cell voltages. In addition, in the battery monitoring device 100A according to the present exemplary embodiment, since the capacitors 21, 22, and 23 have both of a sampling function for holding the cell voltage and a filter function for removing high frequency noise, the filter function may be achieved only by inserting the resistor elements 26, 27, and 28 without separately adding the capacitors for filtering.

Note that, in the exemplary embodiment, a case in which the resistor elements 26, 27, and 28 are provided outside the battery monitoring IC 3 has been described. However, the resistor elements 26, 27, and 28 may be provided inside the battery monitoring IC 3.

In the above first and second exemplary embodiments, cases in which the A/D converter 70 is included in the battery monitoring IC 3 have been described. However, the present disclosure is not limited thereto. For example, the A/D converter 70 may be included inside a microcomputer communicatively connected to the battery monitoring IC 3.

In the above first and second exemplary embodiments, for example, in a case in which the cell voltage of the battery cell 12 is detected, the low potential side switch 52 and the high potential side switch 57 are turned ON, the voltage of the capacitor 21 and the voltage of the capacitor 22 are simultaneously input to the signal processing circuit 6, and a difference of the voltages input is processed by the signal processing circuit 6. However, the present disclosure is not limited thereto. Namely, the voltage of the capacitor 21 and the voltage of the capacitor 22 may be sequentially input to the signal processing circuit 6, and the difference between the voltages may be obtained inside the signal processing circuit 6.

Note that, the battery monitoring IC 3 is an example of the semiconductor device according to the present disclosure. The battery monitoring device 100 and 100A are examples of the battery monitoring device according to the present disclosure. The battery cells 11, 12, and 13 are examples of the battery cell according to the present disclosure. The capacitors 21, 22, and 23 are examples of the charge storage section according to the present disclosure. The sample-and-hold switches 41, 42, and 43 are examples of the first switch according to the present disclosure. The high potential side switches 56, 57, and 58 are examples of the second switch according to the present disclosure. The low potential side switches 51, 52, and 53 are examples of the third switch according to the present disclosure. The signal processing circuit 6 is an example of the processing section according to the present disclosure. The control circuit 7 is an example of the control section according to the present disclosure. The buffer amplifier 61 is an example of the buffer amplifier according to the present disclosure. The cell voltage input terminals 31, 32, and 33 are examples of the first terminal according to the present disclosure. The capacitor connection terminals 36, 37, and 38 are examples of the second terminal according to the present disclosure. The input end a1 is an example of the first input end according to the present disclosure. The input end a2 is an example of the second input end according to the present disclosure. The resistor elements 26, 27, and 28 are examples of the resistor element according to the present disclosure.

What is claimed is:

1. A semiconductor device comprising:
   a plurality of first switches, each provided to correspond to one of a plurality of battery cells connected in series, each first switch including one end connected to a corresponding battery cell from among the plurality of battery cells and another end connected to one electrode of a corresponding charge storage section of a plurality of charge storage sections, each of the charge storage sections being provided to correspond to one of the plurality of battery cells, and each of the charge storage sections comprising another electrode and the another electrodes of the charge storage sections are each connected to a same fixed potential;
   a plurality of second switches, each provided to correspond to one of the plurality of first switches, each second switch including one end connected to the another end of the corresponding first switch;
   a processing section connected to each other end of the plurality of second switches, that processes voltages supplied via the second switches;
   a plurality of first terminals, each connected between a respective one end of the plurality of first switches and the corresponding battery cell; and
   a plurality of second terminals, each connected between a respective another end of the plurality of first switches and a respective one electrode of the plurality of charge storage sections.

2. The semiconductor device according to claim 1, further comprising
   a control section configured to provide control to turn ON each of the plurality of first switches, and then to provide control of each of the plurality of first switches to transition from ON to OFF at a same timing.

3. The semiconductor device according to claim 2, wherein the control section is configured to provide control to turn OFF, and then to provide control of each of the plurality of second switches to be sequentially turned ON; and
   the processing section sequentially processes the voltages that are sequentially supplied via the second switches that have been turned ON.

4. The semiconductor device according to claim 1, wherein the processing section includes a buffer amplifier connected to the other end of each of the plurality of second switches.

5. The semiconductor device according to claim 3, wherein:
   the processing section includes a first input end and a second input end, and outputs an output signal according to a difference between a voltage input to the first input end and a voltage input to the second input end;
   each of the other ends of the plurality of second switches is connected to the first input end of the processing section;
   the semiconductor device further comprises a plurality of third switches, each provided to correspond to one of the first switches corresponding to one of the battery cells, except for a first switch from among the plurality of first switches corresponding to a battery cell from among the plurality of battery cells positioned at a highest potential, each third switch including one end connected to the second input end of the processing section and another end connected to the another end of the corresponding first switch; and in a case in which the control section controls the plurality of second switches to be sequentially turned ON, the control section is configured to control a third switch, from among the plurality of third switches, that corresponds to a battery cell from among the plurality of battery cells that is adjacent, at a low potential side, to a battery cell from among the plurality of battery cells corresponding to the second switch that is turned ON, to be turned ON.

6. The semiconductor device according to claim 1, wherein each one end of the plurality of first switches is connected to the corresponding battery cell via a resistive element.

7. A battery monitoring device comprising:
the semiconductor device according to claim 1;
the plurality of battery cells; and
the plurality of charge storage sections.

8. The semiconductor device according to claim 1, wherein the fixed potential is a ground potential.

9. A semiconductor device connected to a plurality of battery cells connected in series and a plurality of charge storage sections, each of the charge storage sections being provided to correspond to one of the plurality of battery cells, and one end of each charge storage section of the plurality of charge storage sections fixed to a same fixed potential, the semiconductor device comprising:

a plurality of switch pairs respectively corresponding to the plurality of battery cells, each of the switch pairs comprising
a first switch including one end connected to a connection point of a corresponding battery cell of the plurality of battery cells connected in series, and another end connected to another end of a corresponding charge storage section of the plurality of charge storage sections, and
a second switch including one end connected to the another end of the first switch;

a processing section connected to another end of the second switch, the processing section configured to process a voltage input via the second switch and output an output signal that indicates a voltage of the corresponding battery cell;

a plurality of first terminals, each connected between a respective one end of a first switch of the plurality of first switches and the corresponding battery cell; and a plurality of second terminals, each connected between a respective another end of a first switch of the plurality of first switches and a respective another end of the plurality of charge storage sections.

* * * * *